(12) United States Patent
Wang et al.

(10) Patent No.: US 9,859,748 B2
(45) Date of Patent: Jan. 2, 2018

(54) OUTDOOR MULTIFUNCTIONAL SOLAR ENERGY FOLDABLE TABLE

(71) Applicants: Yuan Min Wang, Linhai (CN); Kai Ji, Linhai (CN)

(72) Inventors: Yuan Min Wang, Linhai (CN); Kai Ji, Linhai (CN)

(73) Assignee: Yotrio Group Co., Ltd., Linhai, Zhejiang (CN)

( * ) Notice: Subject to any disclaimer, the term of this patent is extended or adjusted under 35 U.S.C. 154(b) by 17 days.

(21) Appl. No.: 15/250,915

(22) Filed: Aug. 30, 2016

(65) Prior Publication Data
US 2017/0063148 A1    Mar. 2, 2017

(30) Foreign Application Priority Data

Sep. 1, 2015 (CN) .................... 2015 2 0673276 U

(51) Int. Cl.
| | |
|---|---|
| H02J 7/00 | (2006.01) |
| H02J 7/35 | (2006.01) |
| H02J 7/02 | (2016.01) |
| H02S 40/34 | (2014.01) |
| H02S 40/38 | (2014.01) |
| H02S 40/32 | (2014.01) |

(Continued)

(52) U.S. Cl.
CPC .............. *H02J 7/355* (2013.01); *A47B 3/002* (2013.01); *A47B 13/023* (2013.01); *A47B 13/12* (2013.01); *A47B 37/00* (2013.01); *A47B 37/04* (2013.01); *A47B 91/022* (2013.01); *H02J 7/0047* (2013.01); *H02J 7/0052* (2013.01); *H02J 7/025* (2013.01); *H02S 20/30* (2014.12); *H02S 40/32* (2014.12); *H02S 40/34* (2014.12); *H02S 40/38* (2014.12); *A47B 2013/025* (2013.01); *A47B 2200/008* (2013.01); *H02J 2007/0062* (2013.01)

(58) Field of Classification Search
CPC ........ H02J 7/355; H02J 7/0047; H02J 7/0052; H02J 7/025; H02J 2007/0062; H02S 40/32; H02S 20/30; H02S 40/34; H02S 40/38; A47B 3/002; A47B 13/023; A47B 13/12; A47B 37/00; A47B 37/14; A47B 91/022
USPC .......................................... 320/101
See application file for complete search history.

(56) References Cited

U.S. PATENT DOCUMENTS

| | | | | |
|---|---|---|---|---|
| 2011/0265694 A1* | 11/2011 | Portis | ....................... | A45B 3/00 108/50.12 |
| 2014/0009103 A1* | 1/2014 | Nita | ....................... | H02J 7/355 320/101 |
| 2014/0217954 A1* | 8/2014 | Wilde | .................... | A47B 37/04 320/101 |

* cited by examiner

*Primary Examiner* — Nathaniel Pelton
(74) *Attorney, Agent, or Firm* — Jingming (James) Cai; SAC Attorneys LLP

(57) ABSTRACT

An outdoor multifunctional solar energy foldable table includes a table plate, a foldable stand connected beneath the table plate, a vertical column for supporting the foldable stand, and table legs fixed to a lower end of the vertical column. The table plate includes an exterior frame with a control panel, an interior frame inside the exterior frame, a wireless charger positioned on a support on an internal side of the interior frame, inclined support tubes that intersect and connect to the internal side of the interior frame, fixed tubes connected to the inclined support tubes to form a framework structure, a photovoltaic chip positioned on the framework structure, a glass table plate for covering the photovoltaic chip, and a circuit cable box connected to a fixed tube. The circuit cable box includes fourth generation (Continued)

wireless network transmitter/receiver modules, a storage battery, a control chip, and direct current/alternating current circuits.

13 Claims, 5 Drawing Sheets

(51) Int. Cl.
*H02S 20/30* (2014.01)
*A47B 3/00* (2006.01)
*A47B 13/02* (2006.01)
*A47B 13/12* (2006.01)
*A47B 37/00* (2006.01)
*A47B 91/02* (2006.01)
*A47B 37/04* (2006.01)

OUTDOOR MULTIFUNCTIONAL SOLAR ENERGY FOLDABLE TABLE

CROSS-REFERENCE TO RELATED APPLICATIONS

This application claims priority to and the benefit of the non-provisional patent application number 201520673276.6 titled "An Outdoor Multifunctional Solar Energy Foldable Table", filed in the State Intellectual Property Office of the People's Republic of China on Sep. 1, 2015. The specification of the above referenced patent application is incorporated herein by reference in its entirety.

TECHNICAL FIELD

This utility model, in general, relates to outdoor furniture, and more particularly, relates to an outdoor multifunctional solar energy foldable table.

BACKGROUND

As the economy develops rapidly, to reduce resource consumption, use of new energy rationally, new technology, and an improved quality of life have become hot spots. A new energy technology is solar photovoltaic power generation technology which provides a safe, clean and environmentally compatible technology, and is an extensive resource. In recent years, solar photovoltaic power generation technology has developed rapidly. As photoelectric conversion efficiency improves and the cost reduces, solar photovoltaic power generation technology and resultant products find widespread use. As electronic information technology develops rapidly, portable electronic products such as cell phones, digital cameras, tablets, personal computers, etc., have already become necessities of life. These necessities need charging to replenish electric energy in their use process. However, the traditional charging mode uses a mains supply charger which can only work in a place where the mains supply is available, and a dedicated charger must be used for charging the portable electronic products, which is inconvenient. A practical and effective measure is to introduce solar photovoltaic power generation technology into a traditional table or other furniture to provide the traditional table or other furniture with charging functions. Most of the existing technologies use a cable for charging, which is inconvenient and not flexible in use.

Therefore, there is a need for a charging table that has wireless charging functions to increase convenience similar to the solar wireless charging table disclosed in Chinese patent Application No.: CN201420594111.5. The solar wireless charging table comprises an amorphous silicon thin-film solar cell, an I/O controller, a storage battery, a wireless charging transmitter module, and a wireless charging receiver module. The table top of the solar wireless charging table is composed of a piece of an amorphous silicon thin-film solar cell which is made from glass of one of two types, namely, a non-opaque type or an opaque type. The amorphous silicon thin-film solar cell table top is surrounded by the wireless charging transmitter module in the spatial area, and an electric control box is installed on the back of the amorphous silicon thin-film solar cell table top. The I/O controller, the storage battery, and connecting wires are contained in the electric control box. The amorphous silicon thin-film solar cell is connected to the I/O controller by a connecting wire. The I/O controller is connected to the storage battery and the wireless charging transmitter module by the connecting wire. The solar wireless charging table disclosed above realizes the wireless charging function. However, as an outdoor table, the function of the solar wireless charging table is very simple and insufficient for outdoor activities and in its use of solar energy.

SUMMARY OF THE INVENTION

Disclosed herein is an outdoor multifunctional solar energy foldable table that addresses the aforesaid problems of existing technologies. This outdoor multifunctional solar energy foldable table realizes multiple functions such as charging, networking, lighting, etc.

The outdoor multifunctional solar energy foldable table disclosed herein comprises a table plate, a foldable stand, a vertical column used for supporting the foldable stand, and table legs positioned beneath the vertical column. The foldable stand is connected to a place beneath the table plate. The table plate comprises an exterior frame, an interior frame, an inclined support tube 1, an inclined support tube 2, a glass table plate, a circuit cable box, and four fixed tubes. The interior frame is located inside the exterior frame. The inclined support tubes 1 and 2 intersect and connect to the inside of the interior frame. One end of the fixed tube is connected to the inclined support tube 1, while the other end of the fixed tube is connected to the inclined support tube 2. The four fixed tubes form a framework structure on which a photovoltaic chip is positioned. The foldable stand is connected to a place beneath the inclined support tube 1 and the inclined support tube 2. The glass table plate is positioned to cover the photovoltaic chip. The edge of the glass table plate is positioned to cover the interior frame and is positioned to lean against the internal wall of the exterior frame. The interior frame is connected to a support on its internal side. A wireless charger is positioned on the support. The circuit cable box is connected to one of the fixed tubes. A control panel is positioned on the exterior frame. 4G wireless network T/R modules, a storage battery, a control chip, and DC/AC circuits are integrated in the circuit cable box. The photovoltaic chip, the wireless charger, and the control panel are connected to the circuit cable box via a conducting wire. The photovoltaic chip is used to convert optical energy into electric energy, which is stored in the storage battery via the control chip, and further is discharged to the wireless charger via the DC/AC circuits. The wireless charger is used to convert electric energy into an electromagnetic wave which is transmitted to charge a load.

When the outdoor multifunctional solar energy foldable table is used outside in daytime, the control chip is used to detect the quantity of electric energy stored in the storage battery in the circuit cable box. If the storage battery is not full, the photovoltaic chip is connected to charge the storage battery. The charging circuit is disconnected by the control chip after the storage battery is fully charged, and the storage battery is well protected. When an external electronic product having a wireless receiving terminal needs charging, the wireless charging is realized by an inductive coupling technology when the external electronic product approaches the wireless charger. The 4G wireless network function is activated from the control panel.

In an embodiment of the outdoor multifunctional solar energy foldable table, the wireless charger comprises a display lamp, a buzzer, and a wireless charging transmitting terminal, all of which are positioned on the support. The wireless charging status is indicated through the display lamp. The buzzer provides an alarm prompt.

In an embodiment of the outdoor multifunctional solar energy foldable table, there is a strip lamp inside the interior frame which is connected to the circuit cable box by a conducting wire. The strip lamp is lit to realize an illumination function through the control panel. The strip lamp is used as an ambient lamp for creating ambient lighting required by an outdoor activity and for increasing outdoor activity fun.

In an embodiment of the outdoor multifunctional solar energy foldable table, the control panel is integrated with an electric quantity display unit, a wireless signal display unit, a light control switch, a wireless charging status display unit, and a master control switch. Through the control panel, people can view the quantity of electric energy stored in the storage battery and an intensity of a wireless signal, and can control the light control switch and the switches of all other electronic components.

In an embodiment of the outdoor multifunctional solar energy foldable table, the control panel is integrated with a USB charging port. By setting the USB charging port, an electronic product without the wireless charging receiving terminal can be charged.

In an embodiment of the outdoor multifunctional solar energy foldable table, the circuit cable box is fastened by lugs of the circuit cable box from two sides, and is fixed to the exterior side of one of the fixed tubes. The lugs of the circuit cable box hold and lock the circuit cable box, and are used to fix the circuit cable box outside the fixed tube with screws or by sticking the lugs of the circuit cable box to the fixed tube.

In an embodiment of the outdoor multifunctional solar energy foldable table, there is a cover edge on the internal side of the exterior frame. The edge of the glass table plate is located inside the cover edge. The joint between the cover edge and the glass table plate is encapsulated by glass cement. By setting the cover edge and using the glass cement, the outdoor multifunctional solar energy foldable table becomes waterproof.

In an embodiment of the outdoor multifunctional solar energy foldable table, the glass table plate is a dichroic silk-screen printed tempered glass whose thickness is 4~8 mm. The dichroic silk-screen printed tempered glass provides better lighting and transmits light emitted by the strip lamp to enhance ambient lighting for an outdoor activity. The glass table plate with the aforesaid dimension ensures the structural strength of the table top and better light transmission. In an embodiment, the thickness of the dichroic silk-screen printed tempered glass selected for the glass table plate is 5 mm.

In an embodiment of the outdoor multifunctional solar energy foldable table, the vertical column is a hollow cylinder. The foldable stand, the vertical column, and the table legs are connected by a screw rod. The screw rod passes through the axis of the vertical column. The upper end of the screw rod is connected to the foldable stand by a nut while the lower end of the screw rod is connected to the table legs by another nut.

In an embodiment of the outdoor multifunctional solar energy foldable table, an adjusting nut is positioned on the bottom of each of the table legs by which the height of each table leg is adjusted to keep all the table legs at the same level and height, and ensure the stability of the outdoor multifunctional solar energy foldable table.

When compared with existing technologies, the outdoor multifunctional solar energy foldable table disclosed herein has the following advantages:

1. On the premise of maintaining the traditional table, the outdoor multifunctional solar energy foldable table realizes multiple functions such as cabled charging, wireless charging, wireless network connection, and ambient light and lamp illumination, which provides convenience and fun for an outdoor activity.
2. The outdoor multifunctional solar energy foldable table is encapsulated by glass and a colloid material to realize the waterproof effect.
3. The modularized electronic product realizes the function of expandability, makes selections and settings as needed, realizes the diversified carrying and service platforms, and improves consumer experience.

DETAILED DESCRIPTION OF THE INVENTION

The embodiments of the outdoor multifunctional solar energy foldable table 100 are disclosed as follows. Furthermore, the outdoor multifunctional solar energy foldable table 100 is described in conjunction with the figures. However, the outdoor multifunctional solar energy foldable table 100 is not only limited to these embodiments.

Figure 1:
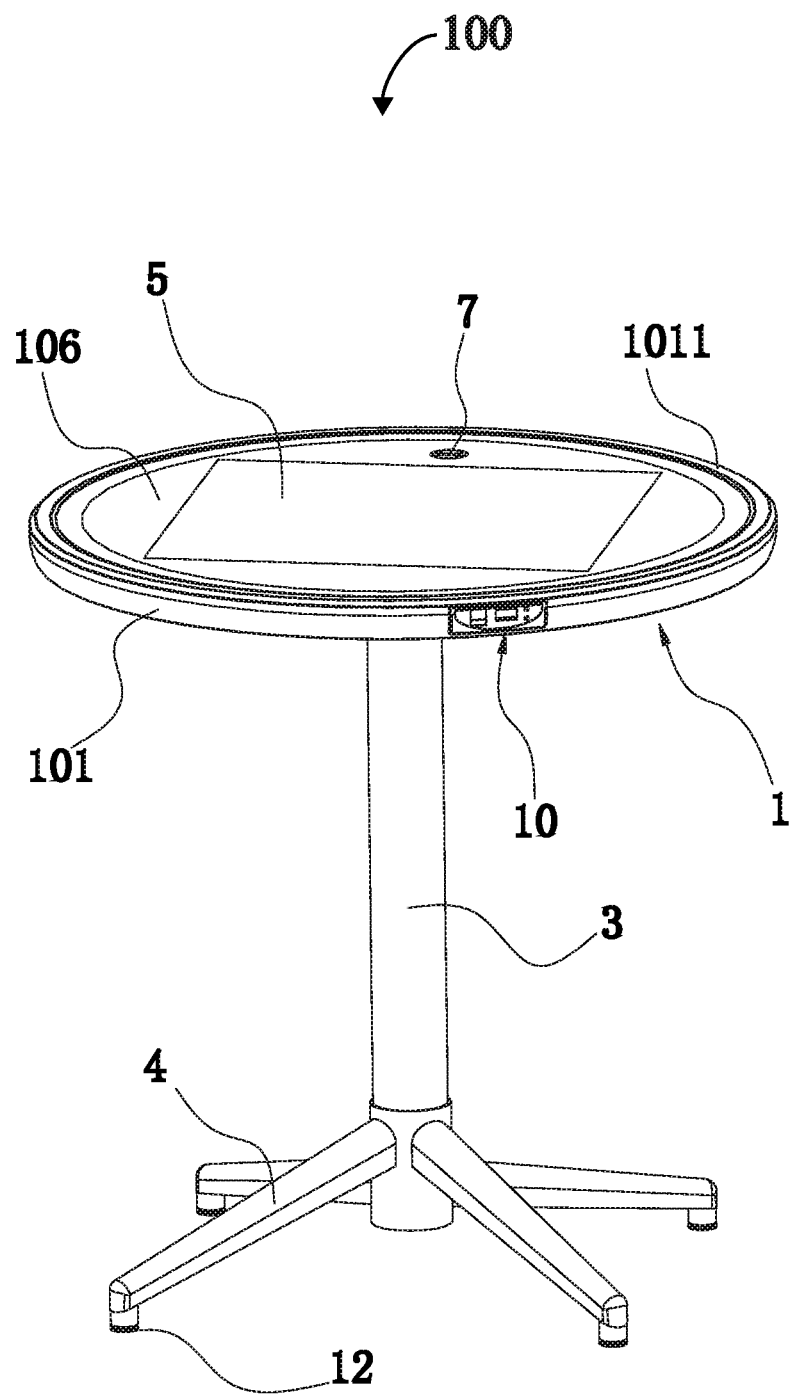
FIG. 1 is a structural diagram of an embodiment of an outdoor multifunctional solar energy foldable table.
Figure 2:
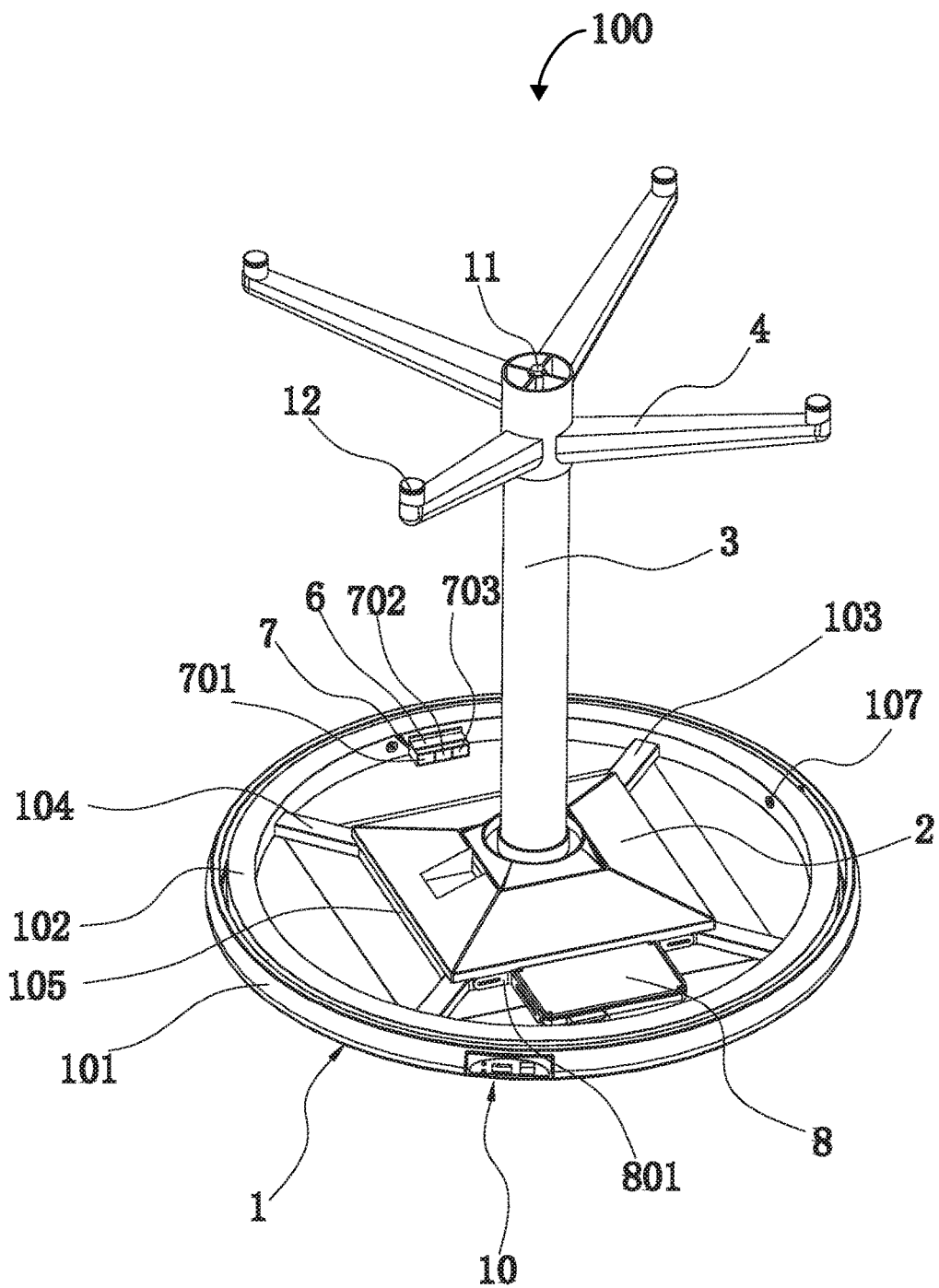
FIG. 2 is a structural diagram of the outdoor multifunctional solar energy foldable table from another perspective.
Figure 3:
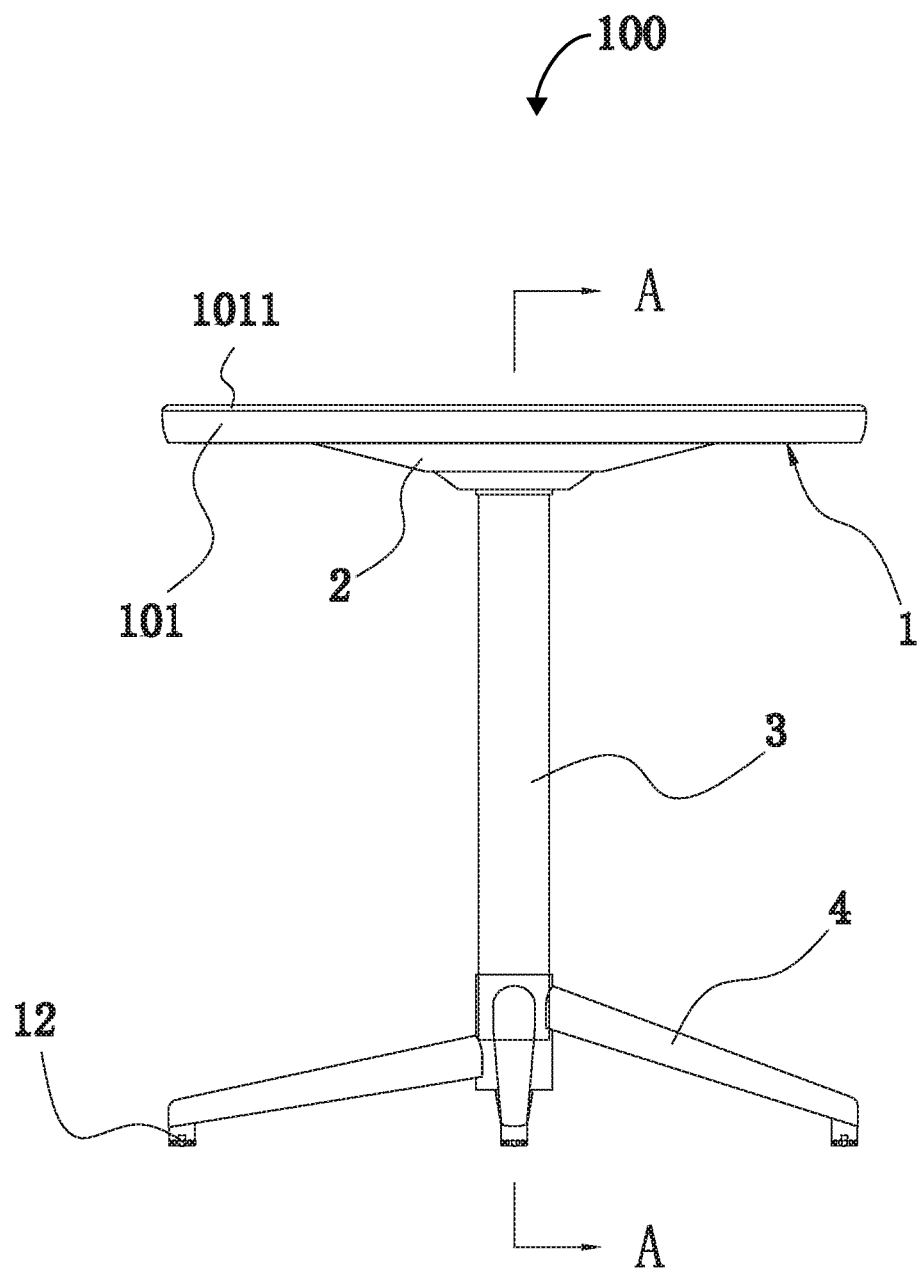
FIG. 3 is a plan view of an embodiment of the outdoor multifunctional solar energy foldable table.
Figure 5:
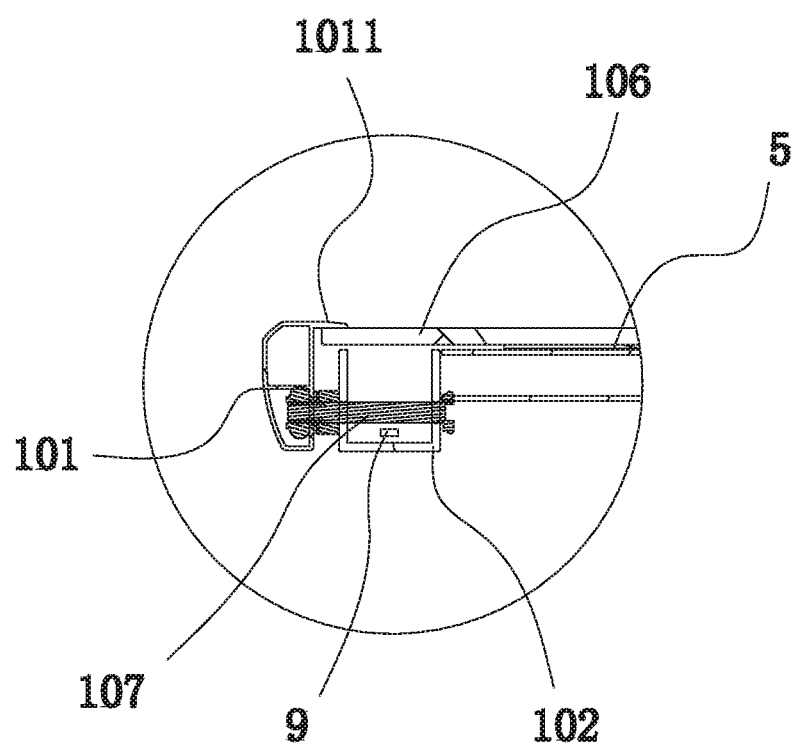
FIG. 5 is an enlarged view of a portion marked B in FIG. 4.

As shown in FIG. 1, FIG. 2, and FIG. 3, the outdoor multifunctional solar energy foldable table 100 comprises a table plate 1, a foldable stand 2, a vertical column 3 used for supporting the foldable stand 2, and table legs 4 positioned beneath the vertical column 3. The table plate 1 comprises an exterior frame 101, an interior frame 102, an inclined support tube 1 103, an inclined support tube 2 104, fixed tubes 105, and a glass table plate 106. The exterior frame 101 and the interior frame 102 are connected by a screw 107 as shown in FIG. 5. The inclined support tube 1 103 and the inclined support tube 2 104 intersect and are welded to the inside of the interior frame 102. The inclined support tube 1 103 and the inclined support tube 2 104 pass through the fixed tubes 105 in turn by ¼ section to form a framework structure on which a photovoltaic chip 5 is positioned. The foldable stand 2 is connected to a place beneath the inclined support tube 1 103 and the inclined support tube 2 104. The glass table plate 106 is positioned to cover the photovoltaic chip 5. The edge of the glass table plate 106 is positioned to cover the interior frame 102 and is positioned to lean against an internal wall of the exterior frame 101. There is a cover edge 1011 on the internal side of the exterior frame 101. The edge of the glass table plate 106 is located inside the cover edge 1011, and the joint between the cover edge 1011 and the glass table plate 106 is encapsulated by glass cement. The glass table plate 106 is a dichroic silk-screen printed tempered glass whose thickness is 4~8 mm. In an embodiment, the thickness of the dichroic silk-screen printed tempered glass selected for the glass table plate 106 is 5 mm. A support 6 is welded to the internal side of the interior frame 102. A wireless charger 7 is positioned on the support 6. The wireless charger 7 comprises a display lamp 701, a buzzer 702, and a wireless charging transmitting terminal 703. The support 6 comprises three cavity chambers which correspond to the display lamp 701, the buzzer 702, and the wireless charging transmitting terminal 703. A strip lamp 9, for example, an LED hard strip lamp is positioned in the interior frame 102. A control panel 10 is positioned on the exterior side of the exterior frame 101.

A circuit cable box 8 is positioned on the exterior side of one of the fixed tubes 105. The circuit cable box 8 is fastened by lugs 801 of the circuit cable box 8 from two sides, and is fixed to the exterior side of the fixed tube 105. The fixing mode herein is, for example, a screw 107, a tape, or a welding approach.

4G wireless network T/R modules, a storage battery, a control chip, and DC/AC circuits are integrated in the circuit cable box 8. The photovoltaic chip 5, the wireless charger 7, the strip lamp 9, and the control panel 10 are connected to the circuit cable box 8 via a conducting wire. The photovoltaic chip 5 is used to convert optical energy into electric energy, which is stored in the storage battery via the control chip, and further is discharged to the wireless charger 7 via the DC/AC circuits. The wireless charger 7 is used to convert electric energy into an electromagnetic wave which is transmitted to charge a load.

The control panel 10 is integrated with an electric quantity display unit, a wireless signal display unit, a light control switch, a wireless charging status display unit, a master control switch, and a USB charging port. Through the control panel 10, people can view the quantity of electric energy stored in the storage battery and an intensity of a wireless signal, and can control the light control switch and the switches of all other electronic components. In addition to the functions disclosed above, an electronic product without a wireless charging receiving terminal can be charged.

Figure 4:
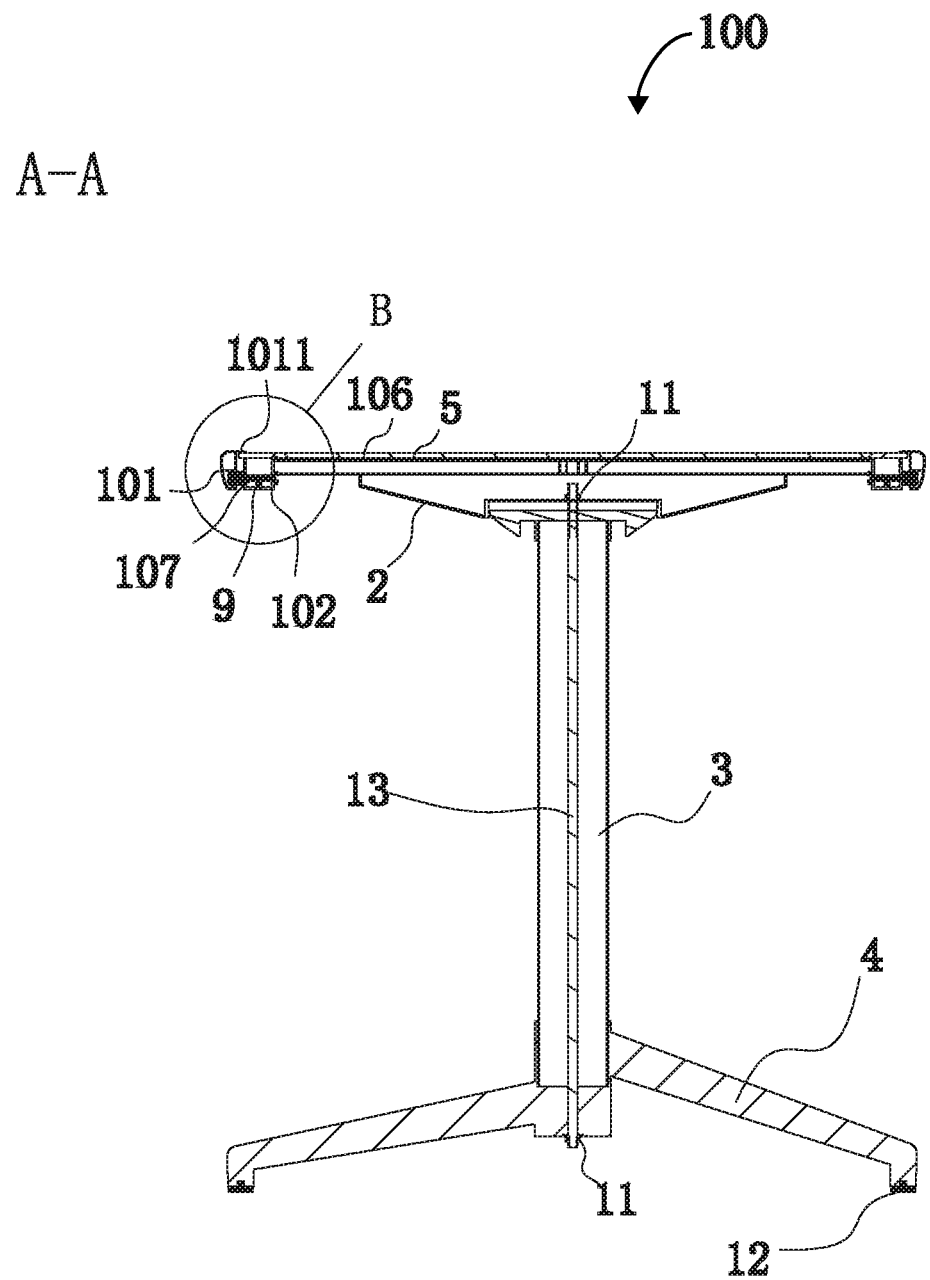
FIG. 4 is a sectional view of the outdoor multifunctional solar energy foldable table taken along a section A-A of FIG. 3.

As shown in FIG. 4, the vertical column 3 is a hollow cylinder. The foldable stand 2, the vertical column 3, and the table legs 4 are connected by a screw rod 13. The screw rod 13 passes through the axis of the vertical column 3. The upper end of the screw rod 13 is connected to the foldable stand 2 by a nut 11 while the lower end of the screw rod 13 is connected to the table legs 4 by another nut 11.

In order to ensure the stability of the outdoor multifunctional solar energy foldable table 100, an adjusting nut 12 is positioned on the bottom of each table leg 4 by which the height of each table leg 4 is adjusted to keep all the table legs 4 at the same level and height.

The working principle of the outdoor multifunctional solar energy foldable table 100 is disclosed herein. When the outdoor multifunctional solar energy foldable table 100 is used outside in daytime, the control chip is used to detect the quantity of electric energy stored in the storage battery in the circuit cable box 8. If the storage battery is not full, the photovoltaic chip 5 is connected to charge the storage battery. The charging circuit is disconnected by the control chip after the storage battery is fully charged, and the storage battery is well protected. The full capacity of the storage battery is 7,800 mA/H.

When an external electronic product having a wireless receiving terminal needs charging and approaches the wireless charger 7, inductive coupling technology provides a stable charging current for charging the external electronic product. After aligning the wireless receiving terminal with the silk-screen mark on the glass table plate 106, the charging will start after the external electronic product is placed on the glass table plate 106. When the equipment encounters a metallic obstruction, an alarm is triggered and a bright red light is emitted. If there is an appropriate charger, a normal operation prompt tone and a bright blue light are triggered. The 4G wireless network functions and the illumination function of the strip lamp 9 are triggered from the control panel 10. In an embodiment, the strip lamp 9 is used as an ambient lamp, which creates ambient lighting required by an outdoor activity at night and increases outdoor activity fun. If an electronic product of a consumer has no wireless charging receiving terminal, the USB charging port can be used to charge the electronic product, which is easy and simple to use.

The outdoor multifunctional solar energy foldable table 100 uses a solar chip with a monocrystal silicon, photovoltaic thin film to provide the power for the electronic product. The solar chip with the monocrystal silicon, photovoltaic thin film has an independent power generating and storage device, and uses an integrated circuit platform to control four modularized functions. First, the ambient light function is provided around the glass table plate 106. Second, the wireless charger 7 is positioned beneath the glass table plate 106 to provide wireless charging for the electronic product with the wireless charging receiving terminal. Third, the USB port is positioned in the control panel 10 to realize cabled charging of the electronic product. Finally, the 4G wireless network function is provided in the integrated circuit platform. A consumer can buy a mobile device or telecom value-added services to realize the wireless network function. In addition to the 4G wireless network, a household wireless signal connection and an enhancement function are provided according to household and outdoor conditions. Through the built-in network communication function, a cloud terminal server of the integrated circuit platform establishes an information push and collection service for users. For example, infrared, Bluetooth and other sensing devices are used to collect daily operation records and interaction information of users, which establish a data file and interactive feedback for the users while pushing and collecting preference information such as a health index, a weather prompt, etc., thereby building an optimal intelligent service platform.

The embodiment disclosed herein is only an example of the outdoor multifunctional solar energy foldable table 100. Technical staff in the field of the outdoor multifunctional solar energy foldable table 100 can make modifications or supplements thereto, or use a similar method for making the outdoor multifunctional solar energy foldable table 100. However, the modifications or supplements cannot deviate from the spirit of the outdoor multifunctional solar energy foldable table 100 or exceed the scope defined by the claims.

We claim:
1. An outdoor multifunctional solar energy foldable table comprising:
   a table plate comprising:
      an exterior frame;
      a control panel positioned on said exterior frame;
      an interior frame located inside said exterior frame and connected to a support positioned on an internal side of said interior frame;
      a wireless charger positioned on said support;
      a first inclined support tube and a second inclined support tube that intersect and connect to said internal side of said interior frame;
      a plurality of fixed tubes, wherein ends of said fixed tubes are connected to said first inclined support tube and said second inclined support tube, and wherein said fixed tubes form a framework structure;
a photovoltaic chip positioned on said framework structure formed by said fixed tubes, wherein said photovoltaic chip converts optical energy into electric energy;
a glass table plate positioned on said photovoltaic chip for covering said photovoltaic chip, wherein edges of said glass table plate cover said interior frame and lean against an internal wall of said exterior frame; and
a circuit cable box connected to one of said fixed tubes;
a foldable stand connected beneath said first inclined support tube and said second inclined support tube of said table plate;
a vertical column connected to said foldable stand for supporting said foldable stand; and
table legs fixed to a lower end of said vertical column.

2. The outdoor multifunctional solar energy foldable table of claim 1, wherein said circuit cable box comprises fourth generation wireless network transmitter and receiver modules, a storage battery for storing said electric energy produced by said photovoltaic chip, a control chip for detecting a quantity of said electric energy in said storage battery, and direct current and alternating current circuits, integrated therewithin.

3. The outdoor multifunctional solar energy foldable table of claim 2, wherein said electric energy produced by said photovoltaic chip is stored in said storage battery via said control chip, and discharged to said wireless charger via said direct current and alternating current circuits, and wherein said wireless charger converts said electric energy into an electromagnetic wave that is transmitted to a load to charge said load.

4. The outdoor multifunctional solar energy foldable table of claim 1, wherein said circuit cable box is affixed to an exterior side of said one of said fixed tubes by lugs extending from two sides of said circuit cable box.

5. The outdoor multifunctional solar energy foldable table of claim 1, wherein said control panel is integrated with an electric quantity display unit that displays a quantity of said electric energy in a storage battery of said circuit cable box, a wireless signal display unit that displays an intensity of a wireless signal, a wireless charging status display unit that displays a wireless charging status, a light control switch, and a master control switch.

6. The outdoor multifunctional solar energy foldable table of claim 1, wherein said control panel is integrated with a universal serial bus charging port for charging an electronic device.

7. The outdoor multifunctional solar energy foldable table of claim 1, wherein said control panel, said wireless charger, and said photovoltaic chip are connected to said circuit cable box via a conducting wire.

8. The outdoor multifunctional solar energy foldable table of claim 1, wherein said wireless charger comprises a display lamp, a buzzer, and a wireless charging transmitting terminal accommodated in said support.

9. The outdoor multifunctional solar energy foldable table of claim 1, further comprising a strip lamp positioned inside said interior frame of said table plate and connected to said circuit cable box via a conducting wire for providing illumination.

10. The outdoor multifunctional solar energy foldable table of claim 1, further comprising a cover edge positioned on an internal side of said exterior frame of said table plate, wherein an edge of said glass table plate is positioned inside said cover edge of said exterior frame, and wherein a joint between said cover edge and said glass table plate is encapsulated by glass cement.

11. The outdoor multifunctional solar energy foldable table of claim 1, wherein said glass table plate is a dichroic silk-screen printed tempered glass of thickness from about 4 millimeters to about 8 millimeters.

12. The outdoor multifunctional solar energy foldable table of claim 1, wherein said vertical column is a hollow cylinder, and wherein said foldable stand, said vertical column, and said table legs are connected by a screw rod passing through an axis of said vertical column, and wherein an upper end of said screw rod is connected to said foldable stand by a first nut and a lower end of said screw rod is connected to said table legs by a second nut.

13. The outdoor multifunctional solar energy foldable table of claim 1, further comprising an adjusting nut positioned on a bottom end of each of said table legs for adjusting height of said each of said table legs.

* * * * *